US012642096B2

(12) United States Patent
Chang et al.

(10) Patent No.: US 12,642,096 B2
(45) Date of Patent: May 26, 2026

(54) SEMICONDUCTOR DEVICE AND METHOD FOR FORMING THE SAME

(71) Applicant: Taiwan Semiconductor Manufacturing Company, Ltd., Hsinchu (TW)

(72) Inventors: Geng-Ming Chang, Taichung City (TW); Chih-Hang Tung, Hsinchu (TW); Chen-Hua Yu, Hsinchu City (TW); Kuo-Chung Yee, Taoyuan City (TW); Kewei Zuo, Xinbei City (TW); Shou-Yi Wang, Hsinchu City (TW); Tzu-Cheng Lin, Hsinchu City (TW); Shih-Wei Liang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 452 days.

(21) Appl. No.: 18/318,240

(22) Filed: May 16, 2023

(65) Prior Publication Data

US 2024/0387447 A1 Nov. 21, 2024

(51) Int. Cl.
H10W 42/00 (2026.01)
H10W 46/00 (2026.01)
(Continued)

(52) U.S. Cl.
CPC ......... H10W 42/00 (2026.01); H10W 42/121 (2026.01); H10W 46/00 (2026.01);
(Continued)

(58) Field of Classification Search
CPC ..... H01L 24/80; H01L 23/544; H01L 23/562; H01L 23/564; H01L 23/585; H01L 24/08;
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| TW | 202002229 A | 1/2020 |
| TW | 202243150 A | 11/2022 |

OTHER PUBLICATIONS

Taiwanese Office Action and Search Report for Taiwanese Application No. 112125822, dated Oct. 11, 2024.
(Continued)

*Primary Examiner* — Thanh Y. Tran
(74) *Attorney, Agent, or Firm* — Birch, Stewart, Kolasch & Birch, LLP

(57) ABSTRACT

A method for forming a semiconductor device is provided. The method includes forming first bonding features and a first alignment mark including first patterns in a top die and forming second bonding features and a second alignment mark in a bottom wafer. The method also includes determining a first benchmark and a second benchmark. The method further includes aligning the top die with the bottom wafer using the first alignment mark and the second alignment mark. In a top view, at least two of the first patterns are oriented along a first direction, and at least two of the first patterns are oriented along a second direction that is different from the first direction. The top die is aligned with the bottom wafer by adjusting a virtual axis passing through the first benchmark and the second benchmark to be substantially parallel with the first direction.

20 Claims, 14 Drawing Sheets

(51) Int. Cl.
  *H10W 90/00* (2026.01)
  *H10W 72/90* (2026.01)
  *H10W 80/00* (2026.01)

(52) U.S. Cl.
  CPC .......... *H10W 90/00* (2026.01); *H10W 46/301* (2026.01); *H10W 72/985* (2026.01); *H10W 80/163* (2026.01); *H10W 80/312* (2026.01); *H10W 80/327* (2026.01); *H10W 90/792* (2026.01)

(58) Field of Classification Search
  CPC ................. H01L 25/0657; H01L 25/50; H01L 2223/54426; H01L 2224/0224; H01L 2224/08145; H01L 2224/8013; H01L 2224/80895; H01L 2224/80896; H01L 2225/06593; H01L 2223/5442; H01L 2223/54453; H01L 21/50; H01L 21/681
  See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2020/0159133 A1* | 5/2020 | Yan | H01L 23/544 |
| 2022/0302078 A1* | 9/2022 | Chang | H01L 22/12 |
| 2022/0310554 A1 | 9/2022 | Chen et al. | |
| 2023/0307412 A1* | 9/2023 | Chang | H01L 23/544 |

OTHER PUBLICATIONS

Taiwanese Office Action and Search Report for Taiwanese Application No. 112125822, dated Jul. 24, 2025.

* cited by examiner

50

300R

100R

200R

1000

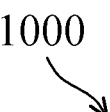

| forming a plurality of first bonding features in a top die | ~ 1010 |

↓

| forming a first alignment mark including a plurality of first patterns in the top die | ~ 1020 |

↓

| determining a first benchmark of the first patterns of the first alignment mark | ~ 1030 |

↓

| forming a plurality of second bonding features in a bottom wafer | ~ 1040 |

↓

| forming a second alignment mark including a plurality of second patterns in the bottom wafer | ~ 1050 |

↓

| determining a second benchmark of the second patterns of the second alignment mark | ~ 1060 |

↓

| attaching the top die to the bottom wafer via the first bonding features and the second bonding features | ~ 1070 |

↓

| aligning the top die with the bottom wafer using the first alignment mark and the second alignment mark by adjusting a virtual axis passing through the first benchmark and the second benchmark to be substantially parallel with a first direction along which at least two of the first patterns are oriented | ~ 1080 |

FIG. 10

SEMICONDUCTOR DEVICE AND METHOD FOR FORMING THE SAME

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (POP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 10 illustrates a flow chart of a method for forming a semiconductor device, in accordance with some embodiments.

DETAILED DESCRIPTION

Figure 1:
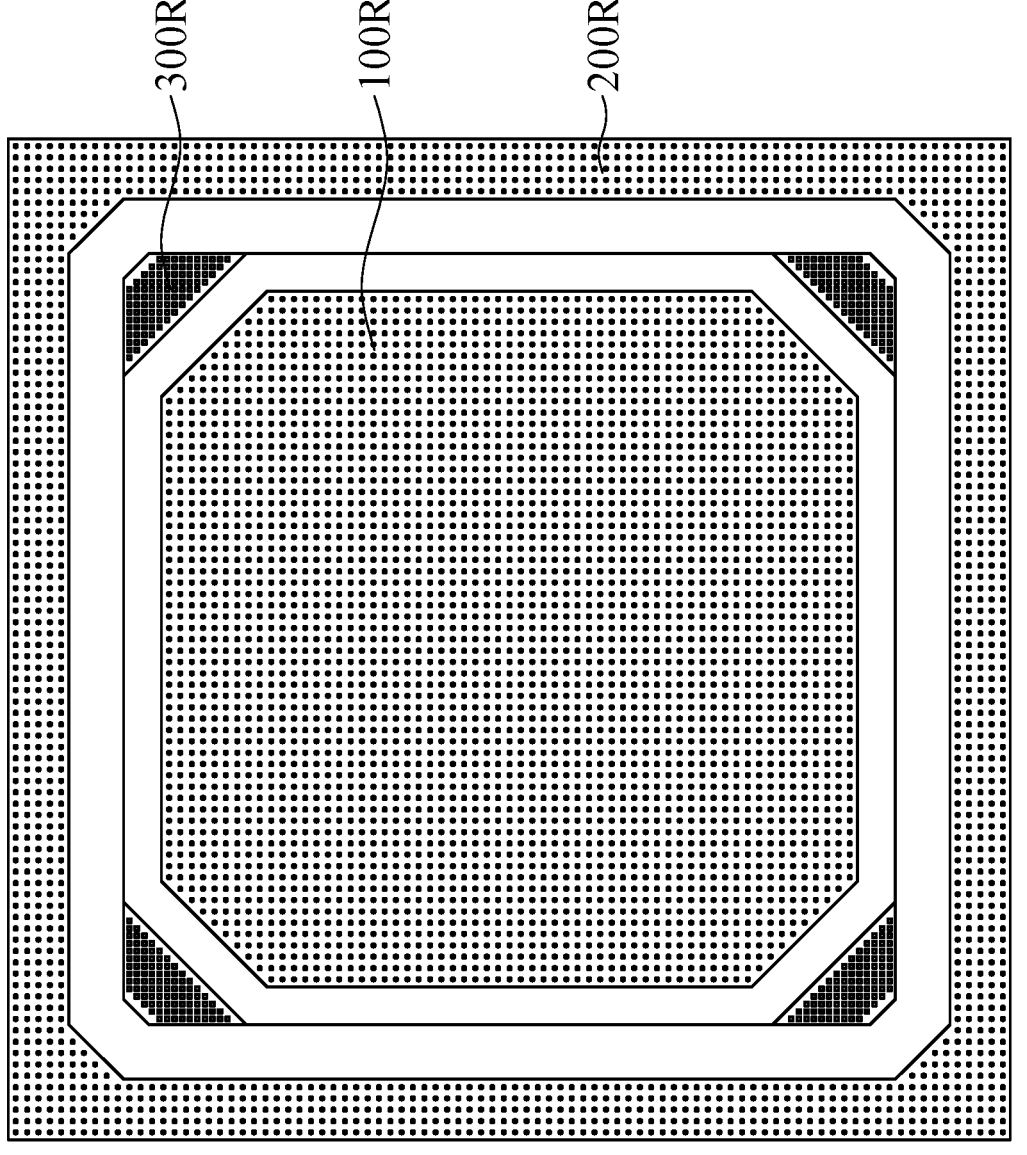
FIG. 1 illustrates a top view of a semiconductor device, in accordance with some embodiments.
Figure 1:
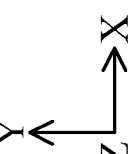

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within $\pm 10\%$ of the number described, based on known manufacturing tolerances associated with manufacturing a feature having a characteristic associated with the number. For example, a material layer having a thickness of "about 5 nm" may encompass a dimension range from 4.25 nm to 5.75 nm where manufacturing tolerances associated with depositing the material layer are known to be $\pm 15\%$ by one of ordinary skill in the art. For avoidance of doubts, the X, Y and Z directions in figures of the present disclosure are perpendicular to one another.

Typically, when two or more semiconductor components are bonded together to form a semiconductor device, an alignment process for aligning such semiconductor components may be performed to improve the performance of the resulting semiconductor device. For example, bonding structures formed on respective semiconductor components may be aligned to increase bond strength between such semiconductor components. During the alignment process, one or more alignment mark formed in the semiconductor components may be used, and a recognition system may be used. The recognition system may include a capturing apparatus capturing the images of the semiconductor device and a recognition apparatus recognizing the one or more alignment marks, thereby determining bond accuracy. However, the existing alignment marks have some drawbacks, such as IR (infrared) distortion and shadow issues. Therefore, bond accuracy can be further enhanced. The present disclosure provides some different examples of alignment marks in a semiconductor device, which effectively enhance bond accuracy.

Figure 2:
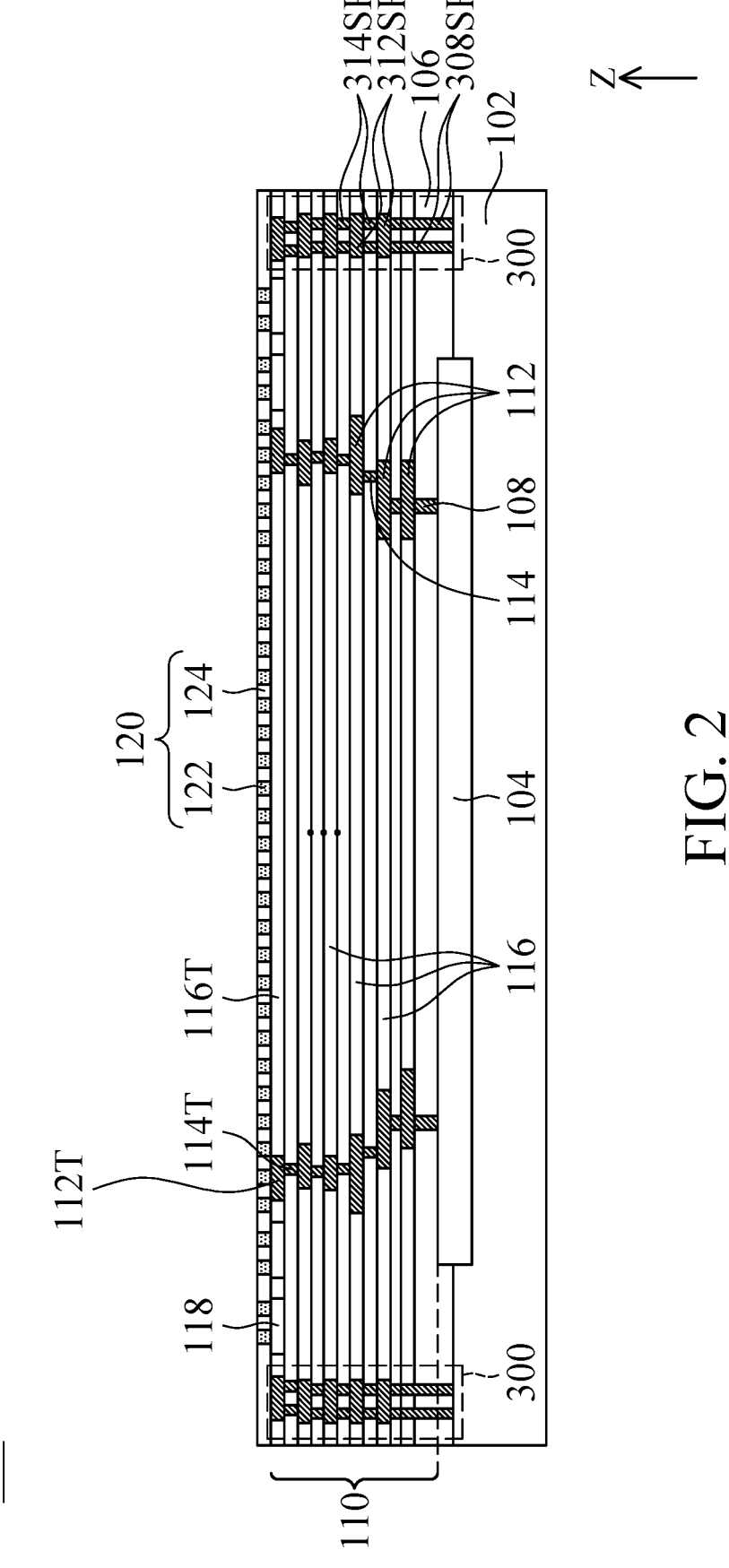
FIG. 2 illustrates a cross-sectional view of a top die of the semiconductor device, in accordance with some embodiments.
Figure 3:
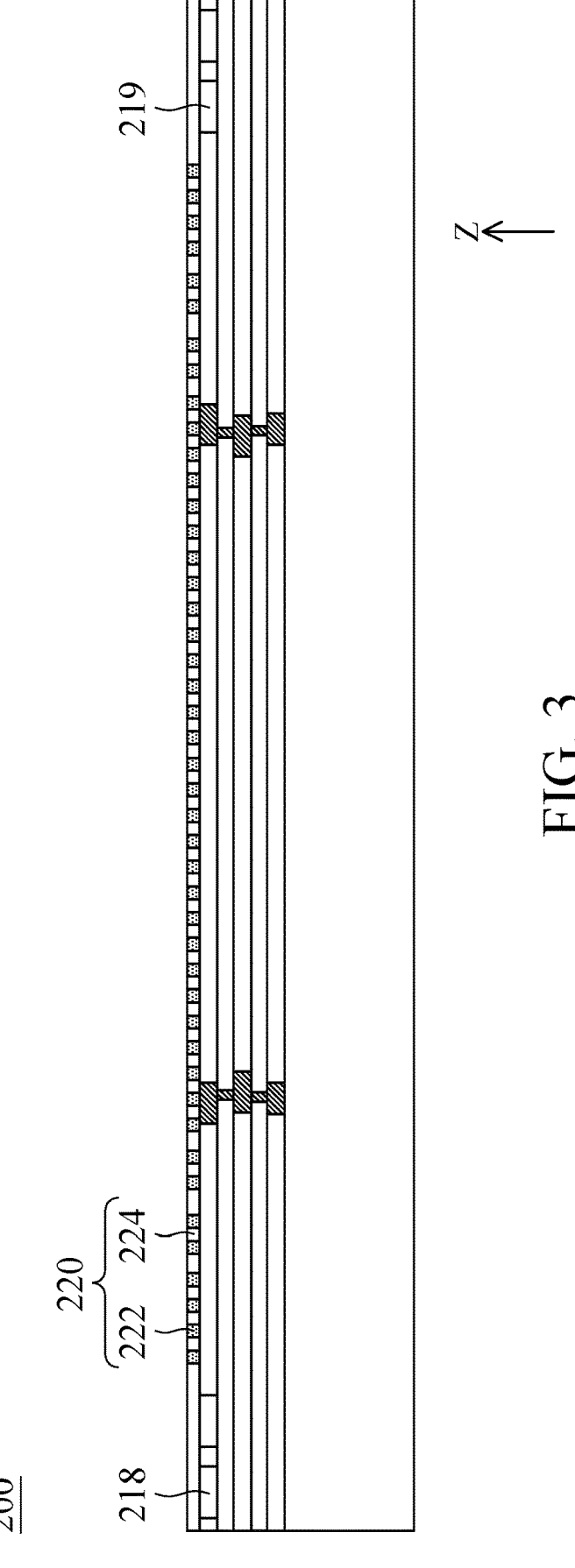
FIG. 3 illustrates a cross-sectional view of a bottom wafer of the semiconductor device, in accordance with some embodiments.

Please refer to FIG. 1, which illustrates a top view of a semiconductor device 50, in accordance with some embodiments. In the top view, the semiconductor device 50 includes a top die region 100R of a top die 100 (details regarding the top die 100 are shown in FIG. 2), a bottom wafer region 200R of a bottom wafer 200 (details regarding the bottom wafer 200 are shown in FIG. 3), and a seal ring structure region 300R of a seal ring structure 300 (details regarding the seal ring structure 300 are shown in FIG. 2) between the top die region 100R and the bottom wafer region 200R. In some embodiments, the seal ring structure region 300R includes different corners. In some embodiments, the corners are trapezoid-shaped.

Next, please refer to FIG. 2, which illustrates a cross-sectional view of the top die 100 of the semiconductor device 50, in accordance with some embodiments. In some embodiments, the top die 100 includes active devices and possibly passive devices, which are represented as an integrated circuit device 104. In some embodiments, the top die 100 is free from active devices, and may or may not include passive devices. In some embodiments, the top die 100 includes a substrate 102 and the features formed over the top surface of the substrate 102. The substrate 102 may include crystalline silicon, crystalline germanium, silicon germanium, carbon-doped silicon, or a III-V compound semiconductor such as GaAsP, AlInAs, AlGaAs, GaInAs, GaInP, GaInAsP, and the like. The substrate 102 may also be a bulk semiconductor substrate or a Semiconductor-On-Insulator (SOI) substrate. Shallow Trench Isolation (STI) regions (not shown) may be formed in the substrate 102 to isolate the active regions in the substrate 102. Although not shown, through-vias may (or may not) be formed to extend into the substrate 102, and the through-vias are used for electrical connection.

The integrated circuit device 104 may be formed on the top surface of the substrate 102. The integrated circuit device 104 may include Complementary Metal-Oxide Semiconductor (CMOS) transistors, resistors, capacitors, diodes, and the like. The details regarding the integrated circuit device 104 are not illustrated herein. In some embodiments, the top die 100 is used for forming interposers (which are free from active devices), and the substrate 102 may be a semiconductor substrate or a dielectric substrate.

An Inter-Layer Dielectric (ILD) 106 may be formed over the substrate 102 and fills the spaces between the gate stacks of transistors (not shown) in the integrated circuit device 104. In some embodiments, the ILD 106 is formed of or includes Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride (SiOxNy), low-k dielectric materials, and the like. The ILD 106 may be formed using spin coating, Chemical Vapor Deposition (CVD), Plasma Enhanced Chemical Vapor Deposition (PECVD), Low Pressure Chemical Vapor Deposition (LPCVD), and the like.

A plurality of contact plugs 108 may be formed in the ILD 106, and the contact plugs 108 are used for electrical connection, for example, the contact plugs 108 may be electrically connected to the integrated circuit device 104. In some embodiments, the contact plugs 108 may include a conductive material selected from tungsten, aluminum, copper, titanium, tantalum, titanium nitride, tantalum nitride, alloys thereof, and/or multi-layers thereof. The formation of the contact plugs 108 may include forming contact openings in the ILD 106, filling a conductive material(s) into the contact openings, and performing a planarization process (such as a Chemical Mechanical Polish (CMP) process or a mechanical grinding process) to level the top surfaces of the contact plugs 108 with the top surface of the ILD 106.

A plurality of metal lines 112 and a plurality of vias 114 may be formed over the ILD 106 and the contact plugs 108. Contact plugs and the overlying metal lines and vias are collectively referred to as an interconnect structure 110. The metal lines 112 and the vias 114 may be formed in different dielectric layers 116 (may be referred to as Inter-metal Dielectrics (IMDs)). The metal lines 112 and the vias 114 may include copper or copper alloys, and they may also include other metals. In some embodiments, the dielectric layers 116 may include low-k dielectric materials. The dielectric constants (k values) of the low-k dielectric materials may be lower than about 3.0, for example. The dielectric layers 116 may include carbon-containing low-k dielectric materials, Hydrogen silsesquioxane (HSQ), Methylsilsesquioxane (MSQ), and the like. In some embodiments, the formation of the dielectric layers 116 includes depositing a porogen-containing dielectric material in the dielectric layers 116 and then performing a curing process to drive out the porogen, and hence the remaining the dielectric layers 116 are porous.

The formation of the metal lines 112 and the vias 114 in the dielectric layers 116 may include single damascene processes and/or dual damascene processes. In a single damascene process for forming a metal line or a via, a trench or a via opening is first formed in one of the dielectric layers 116, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening may be formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, and the like.

For ease of illustration, the topmost dielectric layer of the dielectric layers 116 is denoted as a top dielectric layer 116T. The metal lines in the top dielectric layer 116T are denoted as top metal lines 112T. The topmost vias 114 in the top dielectric layer 116T are denoted as top vias 114T. In some embodiments, the top surface of top dielectric layer 116T and the top surface of the metal lines 112T are on the same plane. In some embodiments, the top surface of the top dielectric layer 116T and the top surface of the metal lines 112T are not on the same plane.

A first alignment mark 118 may be formed in the top dielectric layer 116T. For example, a sacrificial layer may be deposited over the top dielectric layer 116T, and the sacrificial layer may be patterned to form openings. The openings may be filled with an alignment mark material to form the first alignment mark 118. In some embodiments, the alignment mark material includes a conductive material, such as copper, tungsten, gold, silver, aluminum, lead, tin, tantalum, and the like. In some embodiments, the alignment mark material includes an insulating material, such as polybenzoxazole (PBO), polyimide (PI), an epoxy, and the like. In some embodiments, the first alignment mark 118 does not overlap the metal lines 112 and the vias 114 vertically.

A first bonding structure 120 is formed over the top dielectric layer 116T, the top metal lines 112T, and the top vias 114T. The first bonding structure 120 includes a plurality of first bonding features 122 embedded in a first insulating layer 124. The first bonding features 122 may include conductive materials, such as tungsten, aluminum, copper, titanium, tantalum, titanium nitride, tantalum nitride, alloys thereof, and other applicable materials. In some embodiments, the first insulating layer 124 may include inorganic dielectric material materials, such as silicon nitride ($SiN_x$), silicon oxide ($SiO_2$), silicon oxy-nitride ($SiON_x$), silicon oxy-carbide ($SiOC_x$), and the like, combinations thereof, and/or multi-layers thereof. In some embodiments, the first insulating layer 124 may include polymer materials, such as benzocyclobutene (BCB) polymer, polyimide (PI), or polybenzoxazole (PBO).

As shown in FIG. 2, the top die 100 may include a seal ring structure 300. In some embodiments, in the top view, the seal ring structure 300 is formed as a full ring (without breaks therein) surrounding the first bonding features 122. In some embodiments, in the top view, the seal ring structure 300 encloses the first bonding features 122. The seal ring structure 300 may prevent semiconductor components in the top die 100 from being damaged due to mist ingress or stress. For example, multi-gate components, such as fin-like field effect transistors (FinFETs) and multi-bridge-channel (MBC) transistors may be more prone to damages, and an adequate seal ring structure 300 may be required.

The seal ring structure 300 may include a plurality of contact plugs 308SR, a plurality of metal lines 312SR, and a plurality of vias 314SR. The contact plugs 308SR, the metal lines 312SR, and the vias 314SR may be formed at the same time and share the same formation processes as the respective contact plugs 108, metal lines 112, and vias 114. Each of the contact plugs 308SR, metal lines 312SR, and vias 314SR in seal ring structure 300 may be physically joined with the overlying and underlying ones of these features to form an integrated seal ring. In some embodiments, the seal ring structure 300 may be a single-layer structure. For example, the seal ring structure 300 may be formed in the top dielectric layer 116T and not be formed in the rest dielectric layers 116.

In some embodiments, the contact plugs 308SR are electrically connected to the substrate 102. There may be (or may not be) silicide regions between and physically joining contact plugs 308SR and the substrate 102. In some embodiments, the contact plugs 308SR are in physical contact with the substrate 102. In some embodiments, the contact plugs 308SR are spaced apart from the substrate 102 by a dielectric layer, such as the ILD 106, and the like.

Please refer to FIG. 3, which illustrates a cross-sectional view of the bottom wafer 200 of the semiconductor device 50, in accordance with some embodiments. The bottom wafer 200 may include various semiconductor structures, such as active regions, gate structures disposed over channel regions of the active regions, source/drain features disposed over source/drain regions of the active regions, source/drain contacts disposed over source/drain features, and gate contact vias disposed over the gate structures. The active regions may include silicon (Si) or a suitable semiconductor material. Each of the segmented gate structures includes a gate dielectric layer and a gate electrode layer over the gate dielectric layer. In some embodiments, the gate dielectric layer includes an interfacial layer and a high-k gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-k dielectric materials, as used and described herein, include dielectric materials having a high dielectric constant, for example, greater than that of thermal silicon oxide (~3.9). The high-k gate dielectric layer may include hafnium oxide. Alternatively, the high-k gate dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, and the like. The high-k gate dielectric layer may be formed by ALD, physical vapor deposition (PVD), CVD, oxidation, and the like.

The gate electrode layer of the segmented gate structures may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The sourced/drain contacts may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The metal fill layer may include ruthenium (Ru), copper (Cu), nickel (Ni), cobalt (Co), or tungsten (W).

For ease of illustration, FIG. 3 is simplified, and only some components in the bottom wafer 200 are illustrated. In particular, the bottom wafer 200 may include a second alignment mark 218, a third alignment mark 219, and a second bonding structure 220. The second bonding structure 220 includes a plurality of second bonding features 222 embedded in a second insulating layer 224. The formation and materials of the second alignment mark 218 and the third alignment mark 219 may be similar to those of the first alignment mark 118. In addition, the formation and materials of the second bonding structure 220 (i.e. the second bonding features 222 and the second insulating layer 224) may be similar to those of the first bonding structure 120 (i.e. the first bonding features 122 and the first insulating layer 124). The bottom wafer 200 may also include interconnect structures including metal lines and vias formed in different dielectric layers. The related description is not repeated.

Figure 4:
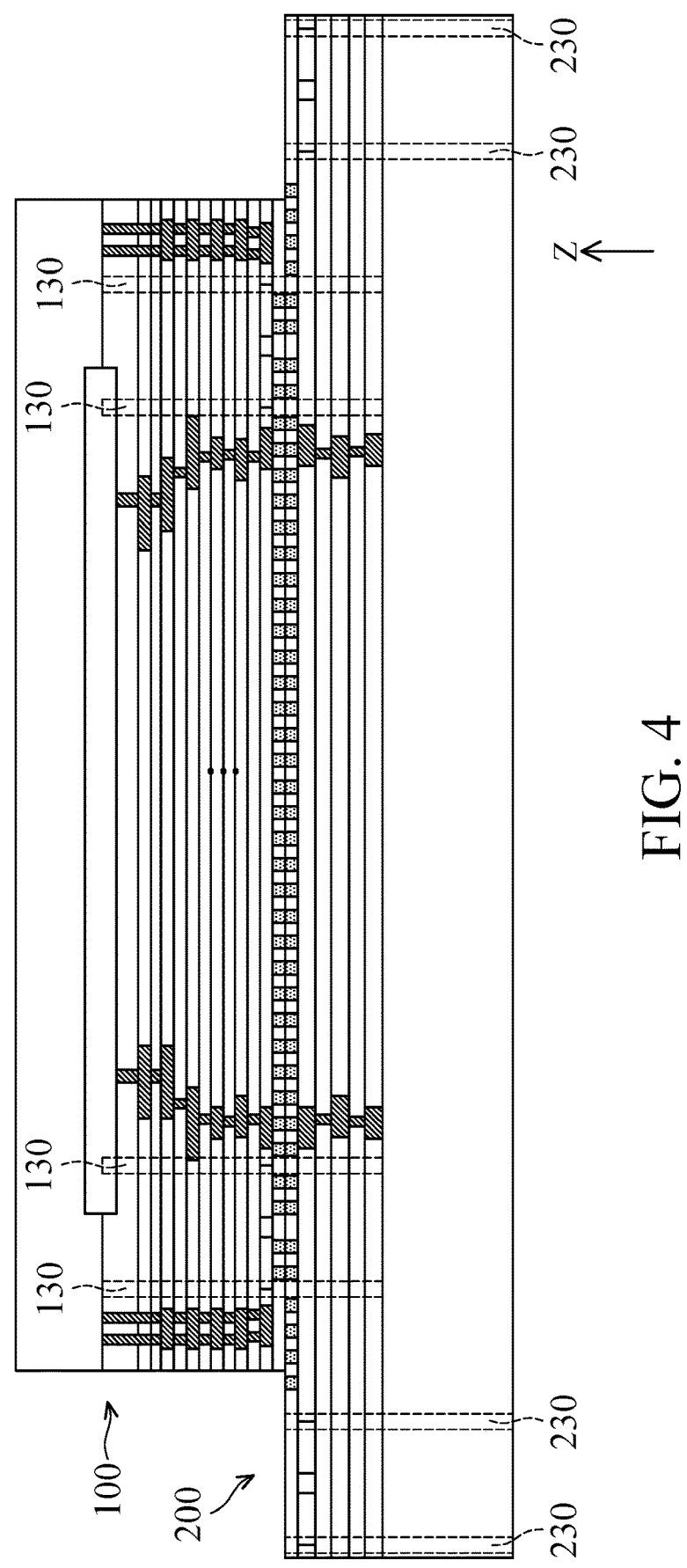
FIG. 4 illustrates a cross-sectional view of the semiconductor device, in accordance with some embodiments.
Figure 5:
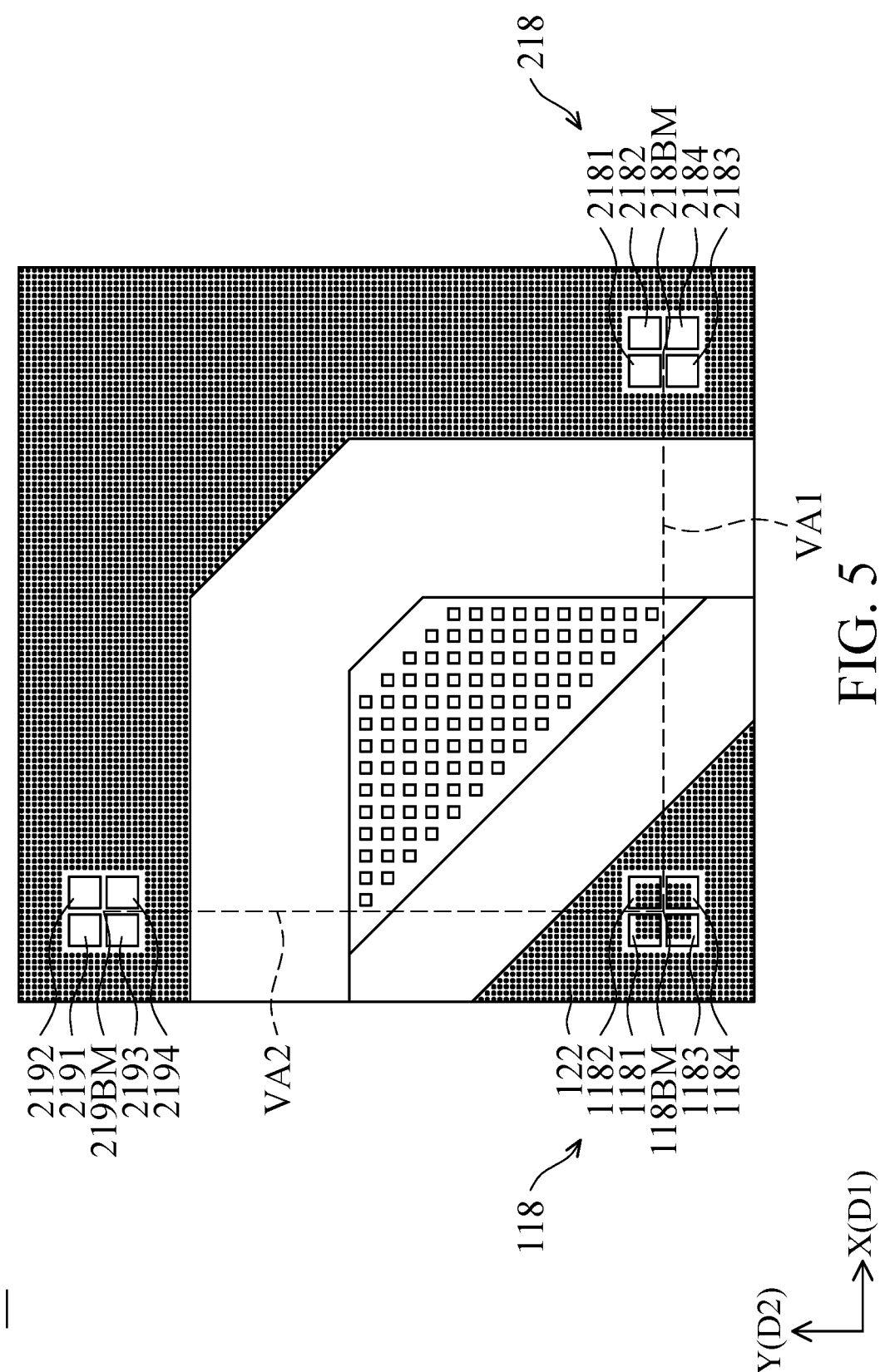
FIG. 5 illustrates an enlarged top view of a portion of the semiconductor device illustrated in FIG. 4, in accordance with some embodiments.

Next, please refer to FIG. 4 and FIG. 5. FIG. 4 illustrates a cross-sectional view of the semiconductor device 50, in accordance with some embodiments. FIG. 5 illustrates an enlarged top view of a portion of the semiconductor device 50 illustrated in FIG. 4, in accordance with some embodiments. The top die 100 may be flipped upside down and then bonded to the bottom wafer 200 to form the semiconductor device 50. In some embodiments, keep-out zones 130 in which no first bonding features 122 and second bonding features 222 are formed may be formed in the top die 100 and the bottom wafer 200. Similarly, keep-out zones 230 in which no second bonding features 222 are formed may be formed in the bottom wafer 200. That is, in the keep-out zones 130, 230, none of the first alignment mark 118, the second alignment mark 218, and the third alignment mark 219 overlaps any bonding features vertically.

When the top die 100 is attached to bottom wafer 200, an alignment process for aligning the top die 100 and the bottom wafer 200 may be performed, so the performance of the resulting semiconductor device 50 may be improved. For example, the top die 100 may be aligned with the bottom wafer 200 in the first direction D1 and/or the second direction D2. The second direction D2 is different from the first direction D1. In some embodiments, the second direction D2 is substantially perpendicular to the first direction D1. For example, the first direction D1 may be parallel with the X-direction shown in FIG. 5, and the second direction may be parallel with the Y-direction shown in FIG. 5.

During the alignment, the first alignment mark 118 in the top die 100, the second alignment mark 218 in the bottom wafer 200, and the third alignment mark 219 in the bottom wafer 200 may be used to ensure that the top die 100 is aligned with the bottom wafer 200. For example, the alignment process may ensure each of the first bonding features 122 is aligned with, and in contact with, the corresponding second bonding feature 222, thereby increasing bond strength between the top die 100 and the bottom wafer 200. Furthermore, a recognition system may be used to recognize the first alignment mark 118, the second alignment mark 218 and/or the third alignment mark 219. By recognizing the positional relationship between the first alignment mark 118 and the second alignment mark 218 and/or the positional relationship between the first alignment mark 118 and the third alignment mark 219, bond accuracy may be determined and improved.

In some embodiments, in the top view, the first alignment mark 118, the second alignment mark 218, and the third alignment mark 219 all include a plurality of patterns. Due to the patterns of the alignment mark, it may be easier for the recognition system to recognize the alignment mark, thereby improving bond accuracy. For example, since multiple patterns may include more edges than a single pattern, it may be easier for the recognition system to recognize the periphery of the patterns. In the embodiments illustrated in FIG. 5, the first alignment mark 118 includes four first patterns 1181-1184, the second alignment mark 218 includes four second patterns 2181-2184, and the third alignment mark 219 includes four third patterns 2191-2194. However, the number, the shape, the configurations of the patterns may vary according to actual needs.

In some embodiments, a first benchmark 118BM of the first patterns 1181-1184 of the first alignment mark 118, a second benchmark 218BM of the second patterns 2181-2184 of the second alignment mark 218, and a third benchmark 219BM of the third patterns 2191-2194 of the third alignment mark 219 may be determined. It should be noted that the benchmark of the patterns of the alignment mark may be arbitrarily determined. For example, the benchmark of the patterns of the alignment mark may be the central point of the entire alignment mark. Alternatively, the benchmark of the patterns of the alignment mark may be the central point of any patterns of the alignment mark, but the position of the benchmark is not limited thereto.

The top die 100 may be aligned with the bottom wafer 200 by adjusting the virtual axis VA1 passing through the first benchmark 118BM and the second benchmark 218BM to be substantially parallel with the first direction D1 and/or adjusting the virtual axis VA2 passing through the first benchmark 118BM and the third benchmark 219BM to be substantially parallel with the second direction D2. In detail, if the top die 100 and the bottom wafer 200 are misaligned, the virtual axis VA1 may not be parallel with the first direction D1 and/or the virtual axis VA2 may not be parallel with the second direction D2. By adjusting the positions of the top die 100 and/or the bottom wafer 200 to make the virtual axis VA1 parallel with the first direction D1 and the virtual axis VA2 parallel with the second direction D2, the top die 100 may be aligned with the bottom wafer 200.

In some embodiments, in the top view, each first pattern 1181-1184 may be square-like. For ease of illustration, the first patterns 1181-1184 are referred to as a first square 1181, a second square 1182, a third square 1183, and a fourth square 1184. The first square 1181 and the second square 1182 are oriented along the first direction D1. The third square 1183 and the fourth square 1184 are also oriented along the first direction D1. The first square 1181 and the third square 1183 are oriented along the second direction D2. The second square 1182 and the fourth square 1184 are also oriented along the second direction D2.

Figure 6A:
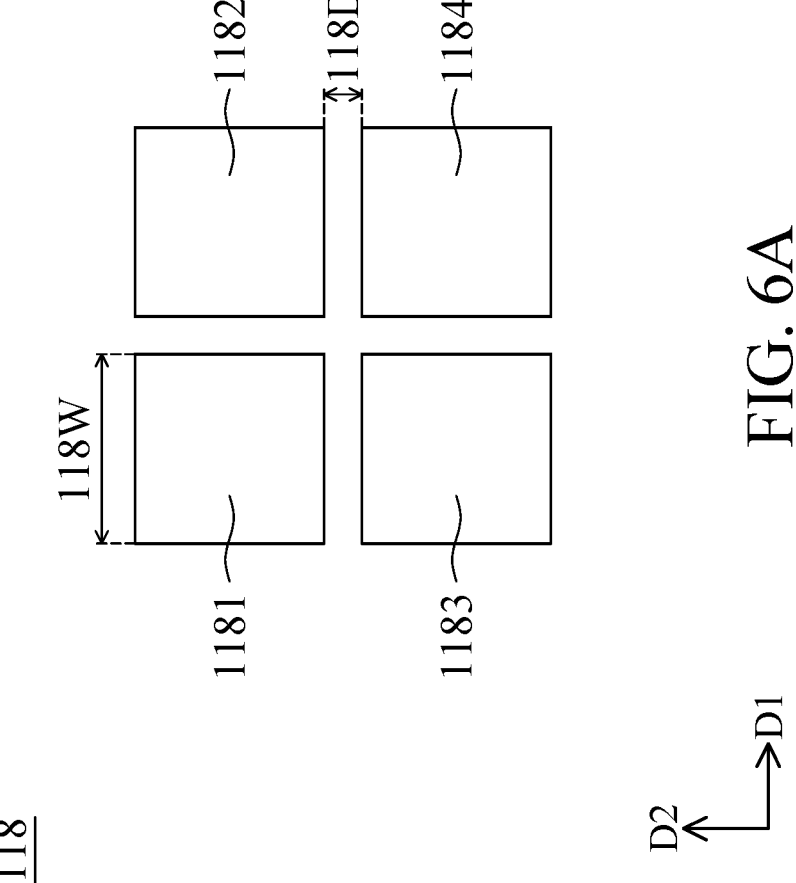
FIG. 6A to FIG. 6C illustrate different configurations of an alignment mark, in accordance with some embodiments.
Figure 6B:
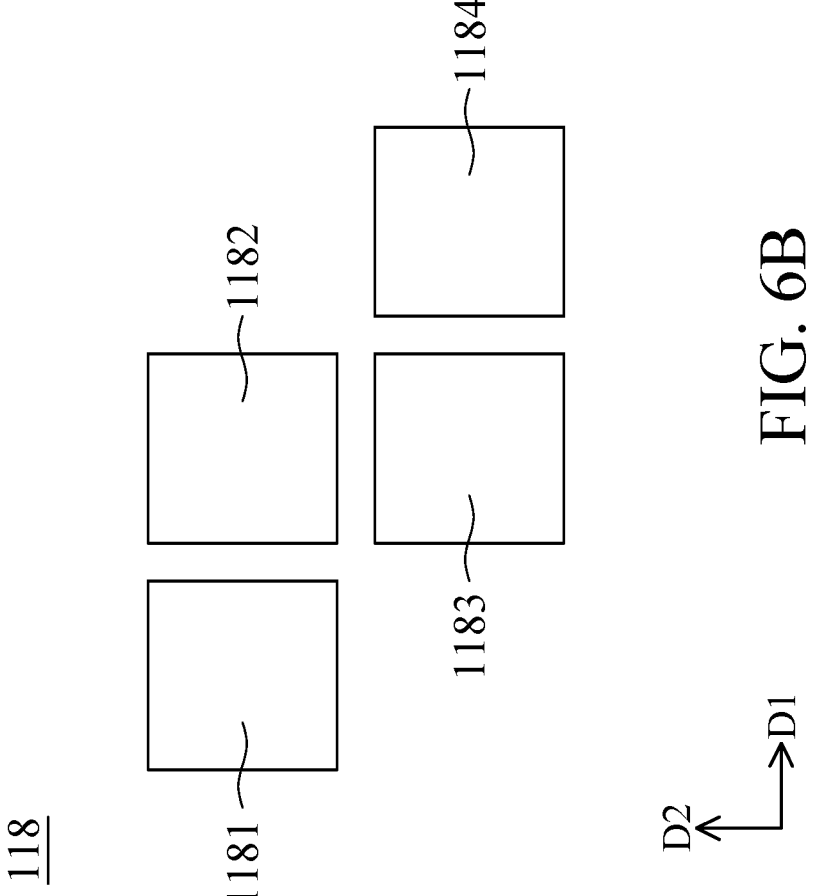
Figure 6C:
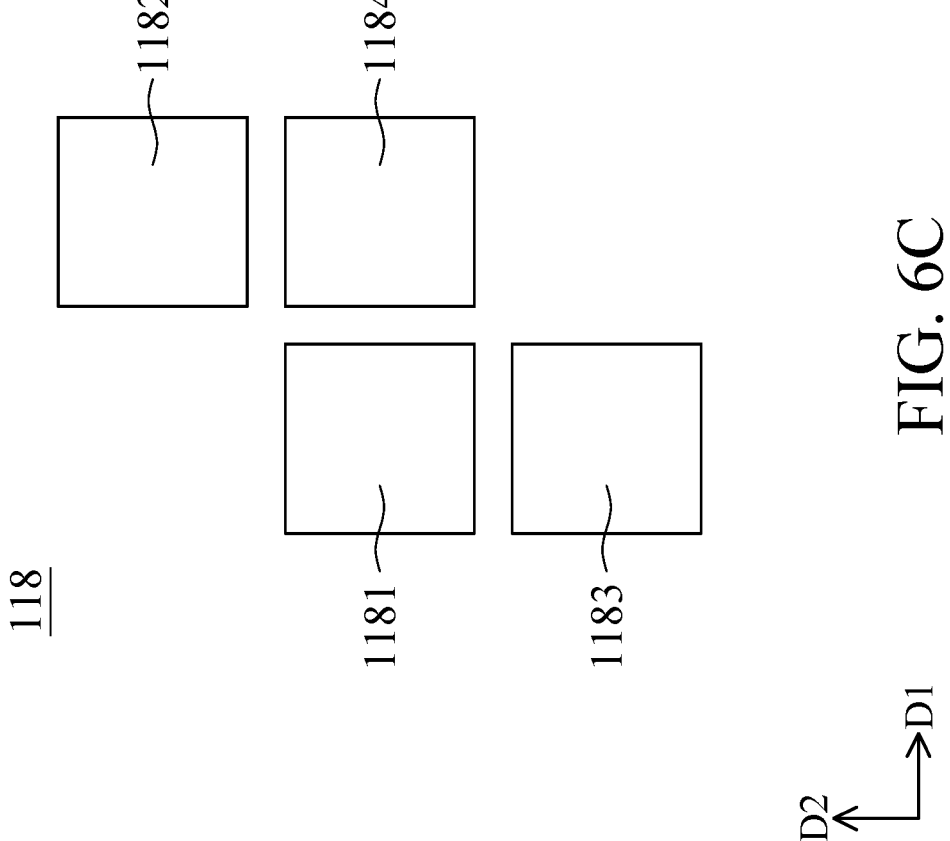

Examples of different configurations of an alignment mark can also be found in FIG. 6A to FIG. 6C. FIG. 6A to FIG. 6C illustrate different configurations of an alignment mark, in accordance with some embodiments. For ease of illustration, the alignment mark is denoted as the first alignment mark 118, but the configurations may also be applied to the second alignment mark 218 and the third alignment mark 219. In the top view, at least two patterns are oriented along the same direction (e.g. the first direction D1), and at least two patterns are oriented along another direction (e.g. the second direction D2). In some embodiments, for each alignment mark, the shape of each pattern may be substantially the same. In addition, in some embodiments, for each alignment mark, the size of each pattern may also be substantially the same. Furthermore, the patterns may be arranged in different ways.

For example, as shown in FIG. 6A, each pattern may be quadrilateral and the multiple patterns may be arranged in a way that the entire alignment mark also seems like a quadrilateral. For example, as shown in FIG. 6B and FIG. 6C, each pattern may be quadrilateral and the multiple patterns may be arranged in a way that the entire alignment mark seems like an irregular polygon. The configurations of the patterns of the alignment mark and the arrangements of different alignment marks are not limited thereto. Any circumstances in which the virtual axis passing through benchmarks of alignment marks may be adjusted to be parallel with a direction along which at least two patterns are oriented fall within the scope of the present disclosure.

Please refer back to FIG. 6A. In some embodiments, the distance 118D between any two adjacent first patterns 1181-1184 is substantially the same. In some embodiments, the distance 118D is in a range from about 1.5 μm to 4.5 μm, such as 2.0 μm to 4.0 μm, but the distance 118D is not limited thereto. In some embodiments, the width 118W of each pattern 1181-1184 is substantially the same. In some embodiments, the width 118W is in a range from about 6.0 μm to about 20.0 μm, such as 9.0 μm to 12.0 μm, but the width 118W is not limited thereto. If the distance 118D is greater than 4.5 μm and/or the width 118W is greater than 20.0 μm, the area that the entire first alignment mark 118 occupied in the top die 100 may be too big, and fewer components can be integrated into the top die 100. If the distance 118D is less than 1.5 µm and/or the width 118W is less than 6.0 µm, it's difficult for the recognition system to recognize the first alignment mark 118. In some embodiments, the distance 118D between two adjacent patterns 1181-1184 of the first alignment mark 118 is less than the width 118W of each pattern 1181-1184 of the first alignment mark 118.

After the alignment is performed, the top die 100 may be bonded to the bottom wafer 200 by heating the top die 100 and the bottom wafer 200 to a certain range of temperature and/or a certain range of pressure, so the first bonding features 122 and the second bonding features 222 are bonded together, and/or the first insulating layer 124 and the second insulating layer 224 are bonded together. In some embodiments, such bonding may provide both covalent bonds (non-metal to non-metal) and metallic bonds (metal to metal), so the top die 100 and the bottom wafer 200 may bond together in a more stable way. In other words, the top die 100 may be attached to the bottom wafer 200 via the first bonding features 122 and the second bonding features 222.

Figure 7:
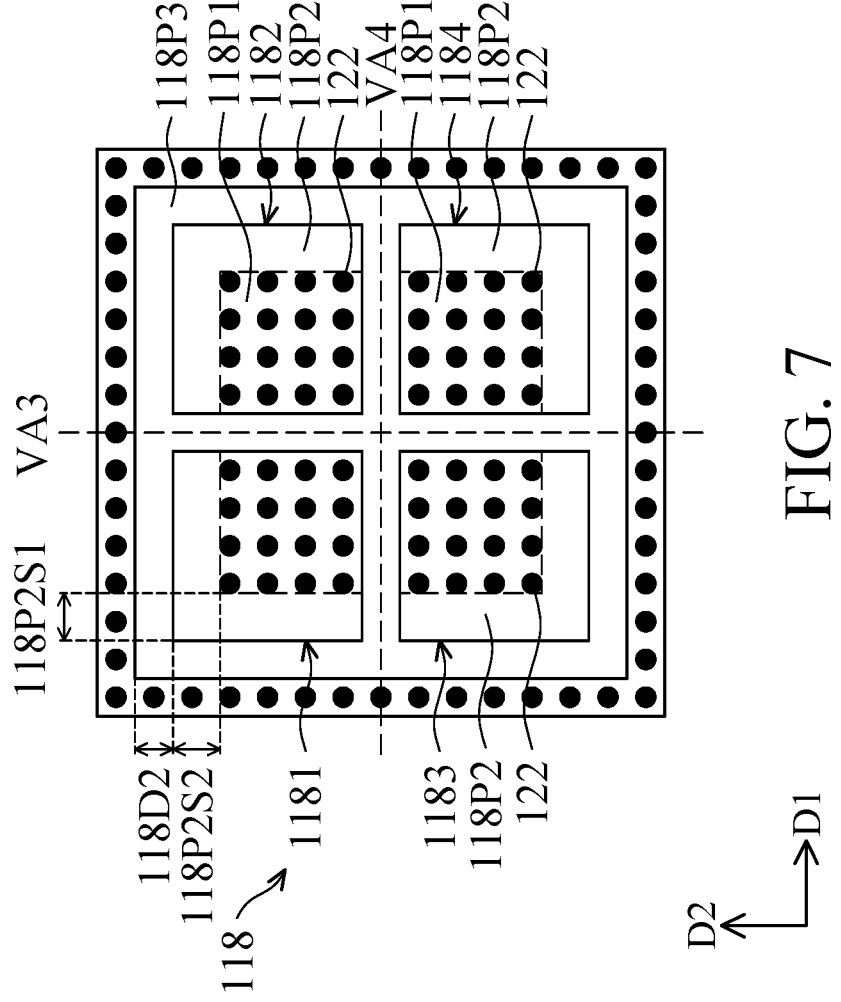
FIG. 7 illustrates an enlarged top view of the configuration of a first alignment mark and first bonding features, in accordance with some embodiments.

Next, please refer to FIG. 7. FIG. 7 illustrates an enlarged top view of the configuration of the first alignment mark 118 and the first bonding features 122, in accordance with some embodiments. In FIG. 7, some of the dashed lines are used to distinguish quadrilateral portions 118P1 and L-shaped portions 118P2 of the first alignment mark 118. In some embodiments, the first bonding features 122 overlap the quadrilateral portions 118P1 of the first patterns 1181-1184 of the first alignment mark 118 vertically without overlapping the L-shaped portions 118P2 of the first patterns 1181-1184 of the first alignment mark 118 vertically. In addition, in the top view, two horizontally-adjacent L-shaped portions 118P2 are substantially symmetrical relative to the virtual axis VA3. The virtual axis VA3 is between two horizontally-adjacent L-shaped portions 118P2 and substantially perpendicular to the first direction D1. Similarly, in the top view, two vertically-adjacent L-shaped portions 118P2 are substantially symmetrical relative to the virtual axis VA4. The virtual axis VA4 is between two vertically-adjacent L-shaped portions 118P2 and substantially perpendicular to the second direction D2.

The edges of the L-shaped portions 118P2 may be the edges of the alignment mark 118. In some embodiments, a surrounding portion 118P3 in which no first bonding features 122 are formed may be further formed around the L-shaped portions 118P2. In some embodiments, the size 118P2S1 of the L-shaped portions 118P2 in the first direction D1 is in a range from about 0.5 µm to 2.0 µm, such as 1.0 µm, but the size 118P2S1 is not limited thereto. In some embodiments, the size 118P2S2 of the L-shaped portions 118P2 in the second direction D2 is in a range from about 0.5 µm to 2.0 µm, such as 1.0 µm, but the size 118P2S2 is not limited thereto. In some embodiments, the size 118P2S1 is substantially the same as the size 118P2S2.

In some embodiments, the distance 118D2 between the outer edge of the L-shaped portions 118P2 and the outer edge of the surrounding portion 118P3 is in a range from about 0.5 µm to 2.0 µm, such as 1.0 µm, but the distance 118D2 is not limited thereto. In some embodiments, the distance 118D2 is substantially the same as the size 118P2S1 and the size 118P2S2. The L-shaped portions 118P2 and the surrounding portion 118P3 may be part of the keep-out zones 130 (denoted in FIG. 4). Due to the keep-out zones 130 (including but not limited to the L-shaped portions 118P2 and the surrounding portion 118P3) that do not overlap the first bonding features 122 vertically and/or the symmetrical arrangement of the L-shaped portions 118P2, IR distortion and shadow issues caused by the first bonding features 122 may be reduced, and noise generated during image processing may also be reduced. Therefore, the image quality captured by the recognition system may be enhanced.

Figure 8:
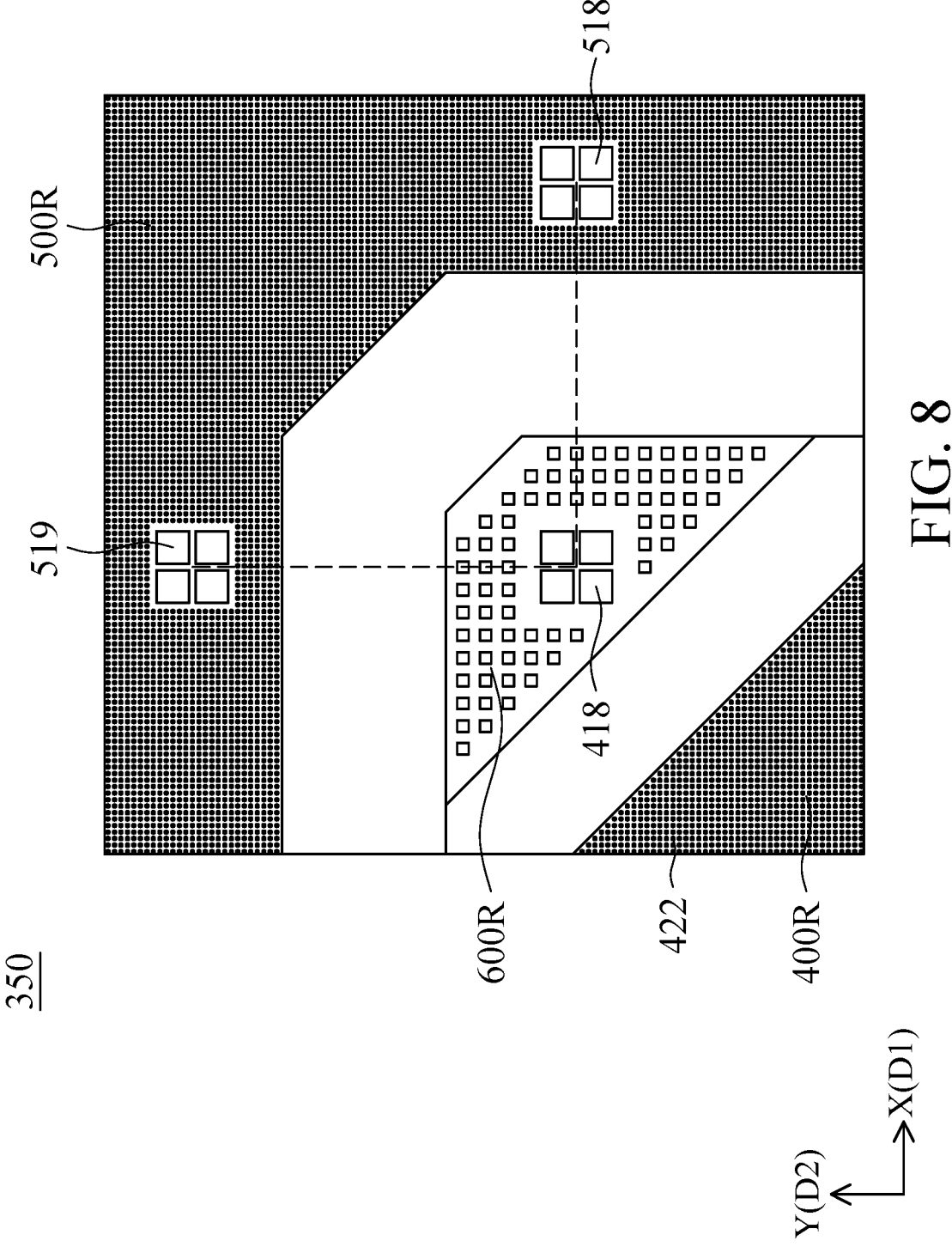
FIG. 8 and FIG. 9A to FIG. 9C illustrate enlarged top views of some other semiconductor devices, in accordance with some embodiments.

Next, please refer to FIG. 8, which illustrates an enlarged top view of another semiconductor device 350, in accordance with some embodiments. In the top view, the semiconductor device 350 includes a top die region 400R of a top die, a bottom wafer region 500R of a bottom wafer, and a seal ring structure region 600R of a seal ring structure between the top die region 400R and the bottom wafer region 500R. In this embodiment, a first alignment mark 418 is formed in the seal ring region 600R. In other words, the first alignment mark 418 at least partially overlapping the seal ring structure without overlapping a plurality of first bonding structures 422 in the top die. Since the first alignment mark 418 is formed in the seal ring region 600R, more components may be integrated into the top die, thereby enhancing the performance of the semiconductor device 350. A second alignment mark 518 and a third alignment mark 519 are formed in the bottom wafer. It should be noted that the positions of the second alignment mark 518 and the third alignment mark 519 are changed correspondingly.

Figure 9A:
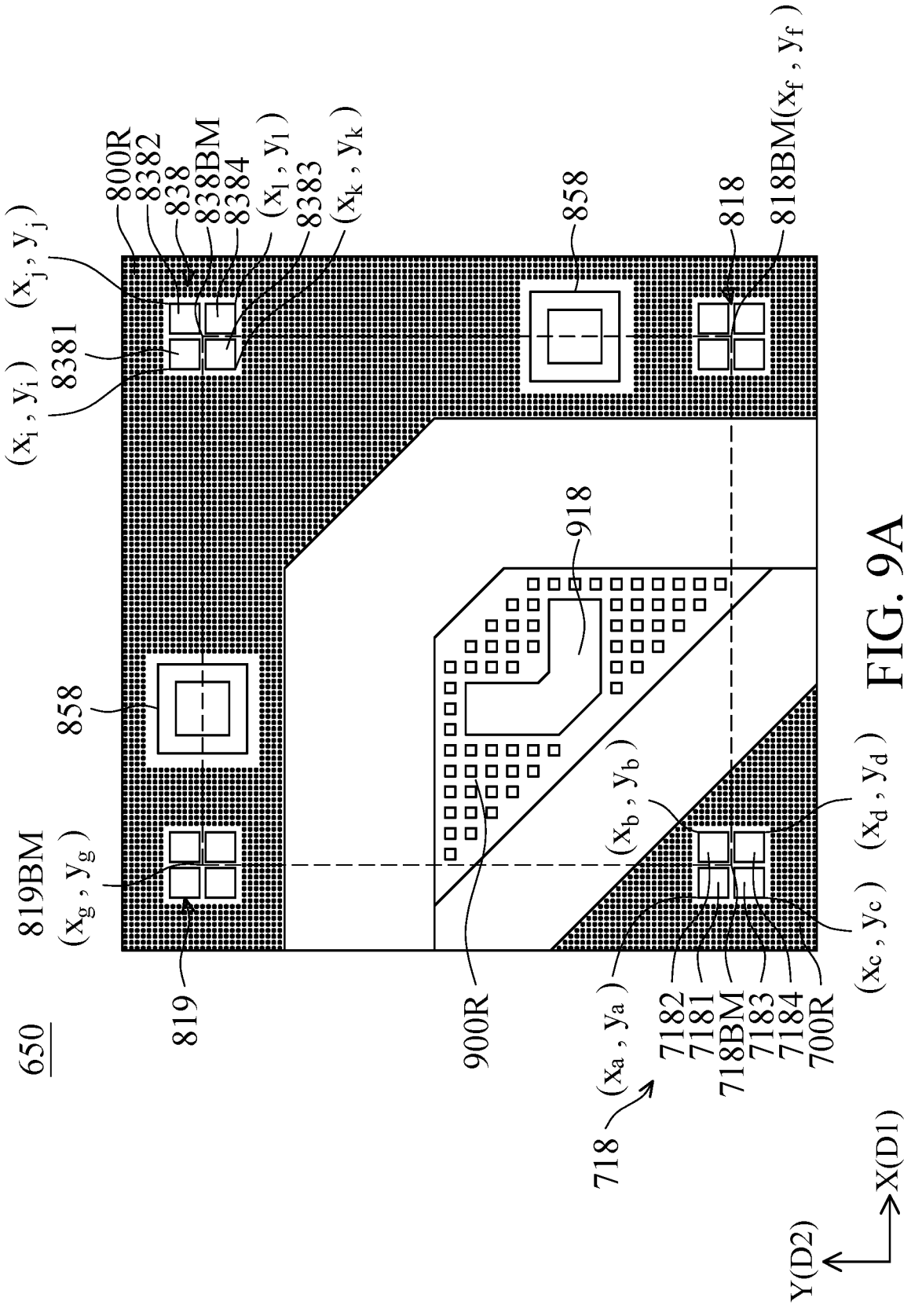
Figure 9B:
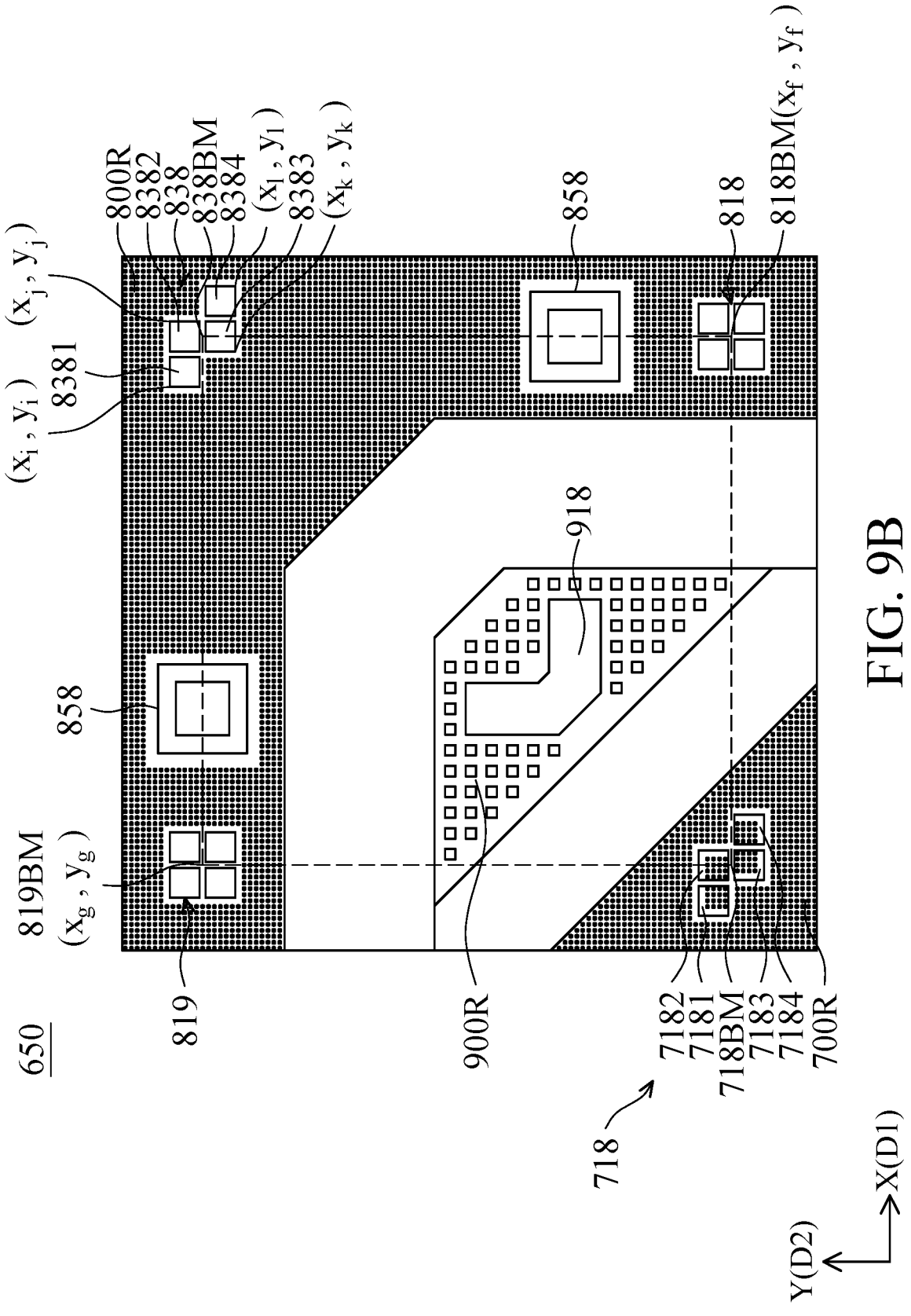
Figure 9C:
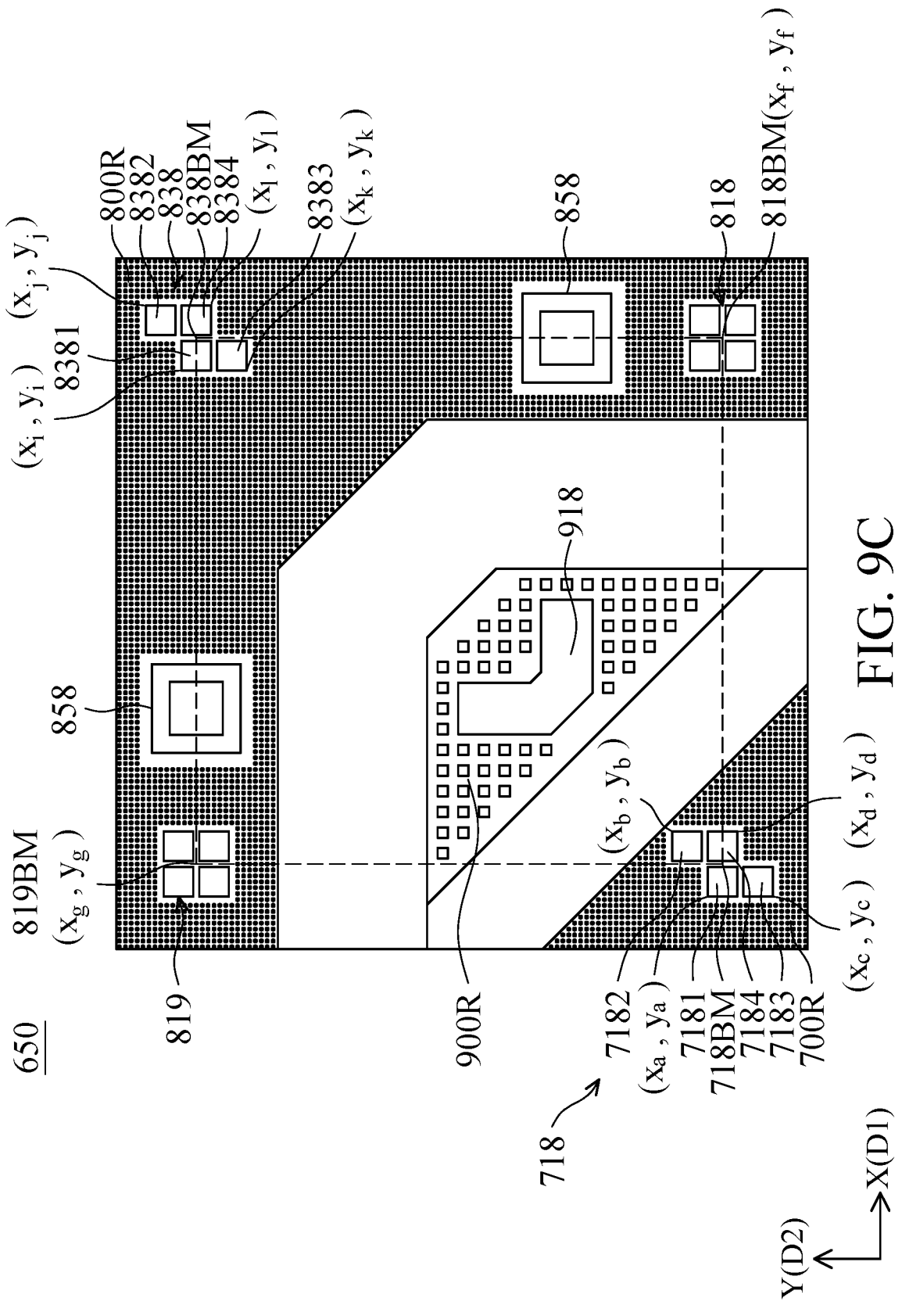

Next, please refer to FIG. 9A to FIG. 9C, which illustrate enlarged top views of another semiconductor device 650, in accordance with some embodiments. In the top view, the semiconductor device 650 includes a top die region 700R of a top die, a bottom wafer region 800R of a bottom wafer, and a seal ring structure region 900R of a seal ring structure between the top die region 700R and the bottom wafer region 800R. In this embodiment, a first alignment mark 718 having four first patterns 7181-7184 (may be referred to as a first square 7181, a second square 7182, a third square 7183, a fourth square 7184) is formed in the top die region 700R.

The shape and the arrangement of the first patterns 7181-7184 in FIG. 9A to FIG. 9C may be substantially the same as those of the first patterns 1181-1184 illustrated in FIG. 6A to FIG. 6C, respectively. In FIG. 9A, the first square 7181 and the second square 7182 are oriented along the first direction D1. The third square 7183 and the fourth square 7184 are also oriented along the first direction D1. The first square 7181 and the third square 7183 are oriented along the second direction D2. The second square 7182 and the fourth square 7184 are also oriented along the second direction D2. In FIG. 9B, the first square 7181 and the second square 7182 are oriented along the first direction D1. The third square 7183 and the fourth square 7184 are also oriented along the first direction D1. The second square 7182 and the third square 7183 are oriented along the second direction D2, while the first square 7181 and the fourth square 7184 are misaligned in both the first direction D1 and the second direction D2. In FIG. 9C, the first square 7181 and the third square 7183 are oriented along the second direction D2. The second square 7182 and the fourth square 7184 are also oriented along the second direction D2. The first square 7181 and the fourth square 7184 are oriented along the first direction D1, while the second square 7182 and the third square 7183 are misaligned in both the first direction D1 and the second direction D2. In addition, a first benchmark 718BM is set as the central point of the entire first alignment mark 718.

A second alignment mark 818 including a plurality of second patterns and a third alignment mark 819 including a plurality of third patterns are formed in the bottom wafer region 800R. A second benchmark 818BM of the second patterns of the second alignment mark 818 and a third benchmark 819BM of the third patterns of the third alignment mark 819 may be determined. For example, the second benchmark 818BM is set as the central point of the entire second alignment mark 818, and the third benchmark 819BM is set as the central point of the entire third alignment mark 819.

In this embodiment, a fourth alignment mark 838 is also formed in the bottom wafer region 800R. The fourth alignment mark 838 includes a plurality of fourth patterns 8381-8384 (may be referred to as a first square 8381, a second square 8382, a third square 8383, a fourth square 8384)). The fourth patterns 8381-8384 are arranged in a way that the first patterns 7181-7184 are arranged.

In FIG. 9A, the first square 8381 and the second square 8382 are oriented along the first direction D1. The third square 8383 and the fourth square 8384 are also oriented along the first direction D1. The first square 8381 and the third square 8383 are oriented along the second direction D2. The second square 8382 and the fourth square 8384 are also oriented along the second direction D2. In FIG. 9B, the first square 8381 and the second square 8382 are oriented along the first direction D1. The third square 8383 and the fourth square 8384 are also oriented along the first direction D1. The second square 8382 and the third square 8383 are oriented along the second direction D2, while the first square 8381 and the fourth square 8384 are misaligned in both the first direction D1 and the second direction D2. In FIG. 9C, the first square 8381 and the third square 8383 are oriented along the second direction D2. The second square 8382 and the fourth square 8384 are also oriented along the second direction D2. The first square 8381 and the fourth square 8384 are oriented along the first direction D1, while the second square 8382 and the third square 8383 are misaligned in both the first direction D1 and the second direction D2. In addition, a fourth benchmark 838BM is set as the central point of the entire fourth alignment mark 838. The fourth alignment mark 838 may be used to know how IR distortion and shadow issues affect the captured images, and thus the fourth alignment mark 838 may be referred to as "a calibration alignment mark."

During the alignment, a first-direction deviation devX and/or a second-direction deviation devY may be calculated to know how IR distortion and shadow issues affect the captured images and then determine the real deviation/misalignment between the top die and the bottom wafer. That is, the first-direction deviation devX and the second-direction deviation devY may represent the overlay (OVL) deviation caused by IR distortion and shadow issues in the X-direction and in the Y-direction, respectively. Furthermore, bond accuracy can be determined based on the first-direction deviation devX and the second-direction deviation devY.

For ease of illustration, different coordinates $(x_a, y_a)$, $(x_b, y_b)$, $(x_c, y_c)$, $(x_d, y_d)$, $(x_f, y_f)$, $(x_g, y_g)$, $(x_i, y_i)$, $(x_j, y_j)$, $(x_k, y_k)$, $(x_l, y_l)$ are denoted in FIG. 9A to FIG. 9C. Corners of the first patterns 7181-7184 may be set as $(x_a, y_a)$, $(x_b, y_b)$, $(x_c, y_c)$, $(x_d, y_d)$. The central point of the second alignment mark 818 (i.e., the second benchmark 818BM) may be set as $(x_f, y_f)$. The central point of the third alignment mark 819 (i.e., the third benchmark 819BM) may be set as $(x_g, y_g)$. Corners of the fourth patterns 8381-8384 may be set as $(x_i, y_i)$, $(x_j, y_j)$, $(x_k, y_k)$, $(x_l, y_l)$. In this embodiment, the first-direction deviation devX and/or the second-direction deviation devY may be used to know real bond accuracy in the X-direction (trueX) and real bond accuracy in the Y-direction (true Y). The real bond accuracy in the X-direction trueX and the real bond accuracy in the Y-direction (true Y) can be described by the following equations:

$$(x_a + x_b + x_c + x_d)/4 - (x_g - devX) = trueX$$

$$(y_a + y_b + y_c + y_d)/4 - (y_f - devY) = trueY$$

If the first-direction deviation devX and the second-direction deviation devY approach zero, IR distortion and shadow issues may be resolved. In short, due to the fourth alignment mark 838, IR distortion and shadow issues may be reduced, and real bond accuracy of the top die and the bottom wafer in the first direction and the second direction can be known. In some embodiments, a correction term may be added to the equations because of different reasons, such as the selected coordinates. Also, the correction term may be determined in advance.

Furthermore, in some embodiments, a seal ring alignment mark 918 may be formed in the seal ring structure region 900R and one or more additional alignment marks 858 corresponding to the seal ring alignment mark 918 may be formed in the bottom wafer region 800R. The seal ring alignment mark 918 and the additional alignment marks 858 may be used to help determine and improve bond accuracy. In some embodiments, the shape of the first alignment mark 718 is different from the shape of the seal ring alignment mark 918. For example, the seal ring alignment mark 918 may be L-shaped or cross-shaped. In some embodiments, the shape of the first alignment mark 718 is different from the shape of the additional alignment marks 858. For example, the additional alignment marks 858 may be two-concentric-square-like. In some embodiment, the shape and the arrangement of the seal ring alignment mark 918 may be substantially the same as those of the first alignment mark 718 illustrated in FIG. 9A to FIG. 9C.

Please refer to FIG. 10, which illustrates a flow chart of a method 1000 for forming a semiconductor device, in accordance with some embodiments. In the operation 1010, the method 1000 includes forming a plurality of first bonding features in a top die. In the operation 1020, the method 1000 includes forming a first alignment mark including a plurality of first patterns in the top die. In the operation 1030, the method 1000 includes determining a first benchmark of the first patterns of the first alignment mark. In the operation 1040, the method includes forming a plurality of second bonding features in a bottom wafer. In the operation 1050, the method 1000 includes forming a second alignment mark including a plurality of second patterns in the bottom wafer. In the operation 1060, the method 1000 includes determining a second benchmark of the second patterns of the second alignment mark.

In the operation 1070, the method 1000 includes attaching the top die to the bottom wafer via the first bonding features and the second bonding features. In the operation 1080, the method 1000 includes aligning the top die with the bottom wafer using the first alignment mark and the second alignment mark by adjusting a virtual axis passing through the first benchmark and the second benchmark to be substantially parallel with a first direction along which at least two of the first patterns are oriented.

The present disclosure provides some different examples of alignment marks in a semiconductor device, which effectively enhance bond accuracy. The alignment mark includes a plurality of patterns, with at least two of them oriented along a first direction and at least two of them oriented along a second direction different from the first direction. In some embodiments, the patterns are squares. Different benchmarks of different alignment marks may be determined, and the virtual lines passing through the benchmarks may be adjusted to be parallel with the first direction and the second direction, thereby aligning the top die with the bottom wafer. In addition, due to the keep-out zones that do not overlap bonding features vertically, IR distortion and shadow issues caused by the bonding features may be reduced, and noise generated during image processing may also be reduced. Therefore, the image quality captured by the recognition system may be enhanced. In some embodiments, a calibration alignment mark may also be used to reduce IR distortion and shadow issues. In some embodiments, the alignment mark may overlap the seal ring structure vertically, allowing more components to be integrated into the top die. In some embodiments, a seal ring alignment mark may be added to help determine and improve bond accuracy.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the present disclosure provide a method for forming a semiconductor device. The method includes forming a plurality of first bonding features in a top die, forming a first alignment mark including a plurality of first patterns in the top die, and determining a first benchmark of the first patterns of the first alignment mark. The method also includes forming a plurality of second bonding features in a bottom wafer, forming a second alignment mark including a plurality of second patterns in the bottom wafer, and determining a second benchmark of the second patterns of the second alignment mark. The method further includes attaching the top die to the bottom wafer via the first bonding features and the second bonding features and aligning the top die with the bottom wafer using the first alignment mark and the second alignment mark. In a top view, at least two of the first patterns are oriented along a first direction, at least two of the first patterns are oriented along a second direction that is different from the first direction, and the top die is aligned with the bottom wafer by adjusting a virtual axis passing through the first benchmark and the second benchmark to be substantially parallel with the first direction.

Some embodiments of the present disclosure provide a method for forming a semiconductor device. The method includes forming a seal ring structure, a plurality of first bonding features, and a first alignment mark at least partially overlapping the seal ring structure without overlapping the first bonding structures in a top die. The method also includes forming a plurality of second bonding features and a second alignment mark in a bottom wafer. The method further includes attaching the top die to the bottom wafer via the first bonding features and the second bonding features and aligning the top die with the bottom wafer using the first alignment mark and the second alignment mark. In a top view, the first alignment mark includes four patterns, and a shape of each of the patterns of the first alignment mark is substantially the same.

Some embodiments of the present disclosure provide a semiconductor device. The semiconductor device includes a top die including a plurality of first bonding features and a first alignment mark including a plurality of patterns. The semiconductor device includes bottom wafer including a plurality of second bonding features in contact with the first bonding features. In a top view, a distance between two adjacent of the patterns of the first alignment mark is less than a width of each of the patterns of the first alignment mark.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming a plurality of first bonding features in a top die;
   forming a first alignment mark comprising a plurality of first patterns in the top die;
   determining a first benchmark of the first patterns of the first alignment mark;
   forming a plurality of second bonding features in a bottom wafer;
   forming a second alignment mark comprising a plurality of second patterns in the bottom wafer;
   determining a second benchmark of the second patterns of the second alignment mark;
   attaching the top die to the bottom wafer via the first bonding features and the second bonding features; and
   aligning the top die with the bottom wafer using the first alignment mark and the second alignment mark,
   wherein in a top view, at least two of the first patterns are oriented along a first direction, at least two of the first patterns are oriented along a second direction that is different from the first direction, and the top die is aligned with the bottom wafer by adjusting a virtual axis passing through the first benchmark and the second benchmark to be substantially parallel with the first direction.

2. The method as claimed in claim 1, wherein the second direction is substantially perpendicular to the first direction.

3. The method as claimed in claim 1, wherein in the top view, each of the first patterns and the second patterns is square-like.

4. The method as claimed in claim 1, further comprising:
   forming a third alignment mark comprising a plurality of third patterns in the bottom wafer; and
   determining a third benchmark of the third patterns of the third alignment mark,
   wherein the top die is aligned with the bottom wafer by adjusting a virtual axis passing through the first benchmark and the third benchmark to be substantially parallel with the second direction.

5. The method as claimed in claim 4, further comprising forming a fourth alignment mark comprising a plurality of fourth patterns in the bottom wafer.

6. The method as claimed in claim 5, further comprising:

calculating a first-direction deviation based on positional relationship between the fourth alignment mark and the second benchmark in the first direction;

calculating a second-direction deviation based on positional relationship between the fourth alignment mark and the third benchmark in the second direction; and determining bond accuracy based on the first-direction deviation and the second-direction deviation.

7. The method as claimed in claim 5, wherein at least two of the fourth patterns are oriented along the first direction, and at least two of the fourth patterns are oriented along the second direction.

8. The method as claimed in claim 1, wherein in the top view, the first bonding features overlap quadrilateral portions of the first patterns of the first alignment mark vertically without overlapping L-shaped portions of the first patterns the first alignment mark vertically.

9. The method as claimed in claim 8, wherein in the top view, two adjacent of the L-shaped portions are substantially symmetrical relative to a virtual axis between the two adjacent of the L-shaped portions, and the virtual axis is substantially perpendicular to the first direction.

10. The method as claimed in claim 1, wherein at least two of the first patterns are misaligned along the first direction and the second direction.

11. The method as claimed in claim 1, further comprising forming a seal ring structure in the top die, wherein in a top view, the seal ring structure encloses the first bonding features.

12. The method as claimed in claim 11, further comprising:

forming a seal ring alignment mark in the seal ring structure;

forming an additional alignment mark corresponding to the seal ring alignment mark in the bottom wafer; and determining bond accuracy based on positional relationship between the seal ring alignment mark and the additional alignment mark.

13. The method as claimed in claim 12, wherein a shape of the first alignment mark is different from a shape of the seal ring alignment mark.

14. A method for forming a semiconductor device, comprising:

forming a seal ring structure, a plurality of first bonding features, and a first alignment mark at least partially overlapping the seal ring structure without overlapping the first bonding features in a top die;

forming a plurality of second bonding features and a second alignment mark in a bottom wafer;

attaching the top die to the bottom wafer via the first bonding features and the second bonding features; and aligning the top die with the bottom wafer using the first alignment mark and the second alignment mark, wherein in a top view, the first alignment mark comprises four patterns, and a shape of each of the patterns of the first alignment mark is substantially the same.

15. The method as claimed in claim 14, wherein the four patterns comprises a first square, a second square, a third square, and a fourth square, the first square and the second square are oriented along a first direction, the third square and the fourth square are also oriented along the first direction, and either the first square or the second square and either the third square or the fourth square are oriented along a second direction that is substantially perpendicular to the first direction.

16. The method as claimed in claim 15, wherein the first square and the third square are oriented along the second direction, and the second square and the fourth square are oriented along the second direction.

17. The method as claimed in claim 15, wherein the second square and the third square are oriented along the second direction, and the first square and the fourth square are misaligned in the first direction and the second direction.

18. A semiconductor device, comprising:

a top die comprising:

a plurality of first bonding features; and a first alignment mark comprising a plurality of first patterns defining a first benchmark; and a bottom wafer comprising:

a plurality of second bonding features in contact with the first bonding features; and a second alignment mark comprising a plurality of second patterns defining a second benchmark, wherein in a top view, a distance between two adjacent first patterns of the first alignment mark is less than a width of each of the first patterns of the first alignment mark, at least two of the first patterns are oriented along a first direction, and at least two of the first patterns are oriented along a second direction that is different from the first direction, and wherein the top die is aligned with the bottom wafer by adjustment of a virtual axis passing through the first benchmark and the second benchmark to be substantially parallel with the first direction.

19. The semiconductor device as claimed in claim 18, wherein the distance between the two adjacent of the patterns is in a range from about 1.5 μm to about 4.5 μm.

20. The semiconductor device as claimed in claim 18, wherein the width of each of the patterns is in a range from about 6.0 μm to about 20.0 μm.

* * * * *